United States Patent
Brobston et al.

(10) Patent No.: US 7,463,875 B2
(45) Date of Patent: Dec. 9, 2008

(54) WIRELESS DEVICE MINIMIZING USE OF EXTERNAL BANDPASS FILTER BETWEEN LOW-NOISE AMPLIFIER AND FIRST MIXER

(75) Inventors: Michael L. Brobston, Allen, TX (US); Seong Eun Kim, Plano, TX (US); Lup M. Loh, Plano, TX (US)

(73) Assignee: Samsung Electronics Co., Ltd., Suwon-si (KR)

( * ) Notice: Subject to any disclaimer, the term of this patent is extended or adjusted under 35 U.S.C. 154(b) by 392 days.

(21) Appl. No.: 11/197,017

(22) Filed: Aug. 4, 2005

(65) Prior Publication Data

US 2006/0068747 A1    Mar. 30, 2006

Related U.S. Application Data

(60) Provisional application No. 60/613,116, filed on Sep. 24, 2004.

(51) Int. Cl.
    *H04B 1/26* (2006.01)
(52) U.S. Cl. .................... 455/324; 455/232.1; 455/323; 455/314; 455/255
(58) Field of Classification Search ................. 455/324, 455/232.1, 323, 314, 255
    See application file for complete search history.

(56) References Cited

U.S. PATENT DOCUMENTS

| | | | |
|---|---|---|---|
| 6,965,656 B2* | 11/2005 | Koizumi | 375/345 |
| 7,076,231 B2* | 7/2006 | Yamawaki et al. | 455/323 |
| 2003/0139147 A1* | 7/2003 | Shi | 455/82 |
| 2004/0137853 A1* | 7/2004 | Tanaka et al. | 455/73 |

* cited by examiner

*Primary Examiner*—Sanh D Phu

(57) ABSTRACT

A receiver system design and architecture that implements a 3-step gain LNA and an analog VGA for a WCDMA handsets and local area base stations, providing a wireless device eliminating the use of external bandpass filter between low-noise amplifier and first mixer.

8 Claims, 4 Drawing Sheets

WIRELESS DEVICE MINIMIZING USE OF EXTERNAL BANDPASS FILTER BETWEEN LOW-NOISE AMPLIFIER AND FIRST MIXER

CROSS-REFERENCE TO RELATED APPLICATION AND CLAIM OF PRIORITY

The present invention is related to that disclosed in U.S. Provisional Patent No. 60/613,116, filed Oct. 23, 2004, entitled "Wireless Device Minimizing Use of External Bandpass Filter Between Low-Noise Amplifier and First Mixer". U.S. Provisional Patent No. 60/613,116 is assigned to the assignee of the present application. The subject matter disclosed in U.S. Provisional Patent No. 60/613,116 is hereby incorporated by reference into the present disclosure as if fully set forth herein. The present application hereby claims priority under 35 U.S.C. §119(e) to U.S. Provisional Patent No. 60/613,116.

TECHNICAL FIELD OF THE INVENTION

The present invention is directed generally to an RF receiver architecture that minimizes the need for an external bandpass filter between the LNA and the first mixer.

BACKGROUND OF THE INVENTION

At present, no design for a WCDMA receiver for handsets or local area base stations meets the 3GPP TS25.101 standard without an external inter-stage filter between the low-noise amplifier (LNA) and the mixer for Class I through Class VI devices. Conventional designs for WCDMA handset and base station receivers become unattractive in multi-band applications due to numerous external filter requirements and complex ASIC pin-outs. More external components also require additional printed circuit board (PCB) space. In addition, the use of higher external component count reduces flexibility and configurability of the receiver.

Therefore, there is a need in the art for an improved receiver architecture for use in WCDMA handsets and base stations that minimizes the need for external filters. In particular, there is a need for a receiver architecture that minimizes the need for external RF SAW filters.

SUMMARY OF THE INVENTION

The present invention provides a receiver architecture that implements a 3-step gain LNA for WCDMA handsets and local area base stations. The present invention also implements a limited dynamic range baseband analog variable gain amplifier (VGA) up to a maximum of 10 dB in gain in front of the $\Sigma\Delta$ analog-to-digital converter (ADC) to supplement for any LNA switched out gain or a lower gain designed in the LNA due to mixer linearity limitations The present invention achieves the purpose of reducing the noise figure impact of the ADC on the receiver sensitivity and without setting gain so high so as to require high selectivity analog filtering at baseband, which is difficult to integrate and detrimental to performance in terms of group delay variations.

The present invention introduces a unique combination of an analog VGA and digital VGA (in the digital IF) to satisfy receiver performance and gain dynamic range requirement. The absence of an external inter-stage filter in the receiver design also makes it compatible with GSM/EDGE receiver design and allows the same receiver channel to serve both modes without complicated integrated switching. At the same time, it facilitates the deign of a single broadband mixer and the prospective of a broad band LNA with a tunable MEMS duplexer at the antenna to further reduce the receiver design, pin-outs, and die area.

According to various aspects of the present invention, there is provided a radio-frequency (RF) receiver comprising a 3-step gain low-noise amplifier stage for amplifying a received RF signal; a direct conversion mixer for down-converting an amplified output of said 3-step gain low-noise amplifier; and a variable gain amplifier for amplifying a down-converted output of said direct conversion mixer.

According to another aspect of the present invention, there is provided a mobile station for use in a wireless network system, comprising a processor and accessible memory; and a transceiver connected to communicate with the processor, the transceiver having a 3-step gain low-noise amplifier stage for amplifying a received RF signal, a direct conversion mixer for down-converting an amplified output of said 3-step gain low-noise amplifier, and a variable gain amplifier for amplifying a down-converted output of said direct conversion mixer.

According to another aspect of the present invention, there is provided a base station for use in a wireless network system, comprising a processor and accessible memory; and a transceiver connected to communicate with the processor, the transceiver having a 3-step gain low-noise amplifier stage for amplifying a received RF signal, a direct conversion mixer for down-converting an amplified output of said 3-step gain low-noise amplifier, and a variable gain amplifier for amplifying a down-converted output of said direct conversion mixer.

BRIEF DESCRIPTION OF THE DRAWINGS

For a more complete understanding of the present invention and its advantages, reference is now made to the following description taken in conjunction with the accompanying drawings, in which like reference numerals represent like parts.

DETAILED DESCRIPTION OF THE INVENTION

FIGS. 1 through 4, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged wireless receiver architecture.

Figure 1:
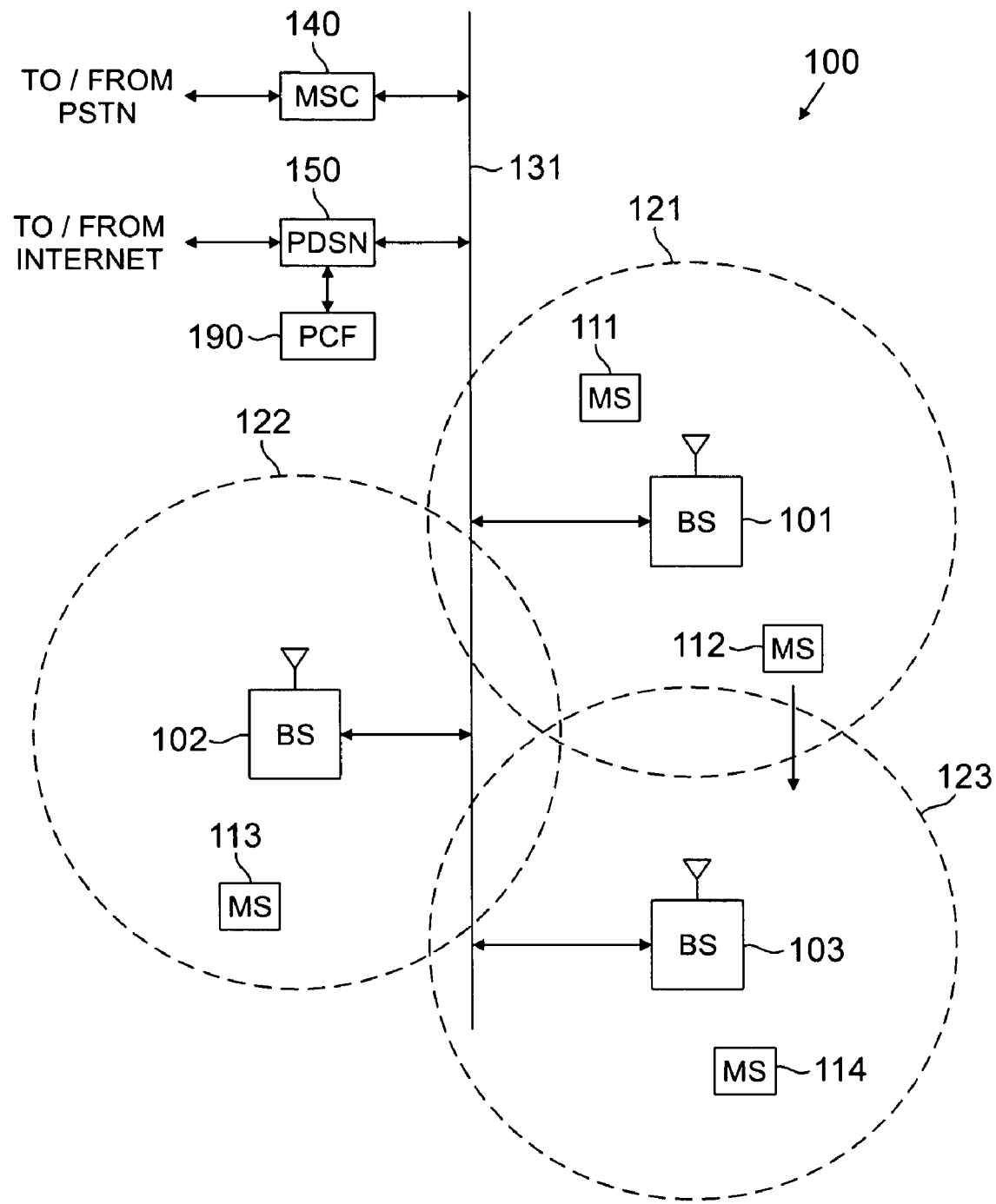
FIG. 1 illustrates exemplary wireless network according to the principles of the present invention.

FIG. 1 illustrates exemplary wireless network 100, according to the principles of the present invention.

Wireless network 100 comprises a plurality of cell sites 121-123, each containing one of the base stations, BS 101, BS 102, or BS 103. Base stations 101-103 communicate with a plurality of mobile stations (MS) 111-114 over code division multiple access (CDMA) channels according to, for example, the 3GPP standard (i.e., WCDMA). In an advantageous embodiment of the present invention, mobile stations 111-114 are capable of receiving data traffic and/or voice traffic on two or more CDMA channels simultaneously. Mobile stations 111-114 may be any suitable wireless devices (e.g., conventional cell phones, PCS handsets, personal digital assistant (PDA) handsets, portable computers, telemetry devices) that are capable of communicating with base stations 101-103 via wireless links.

The present invention is not limited to mobile devices. The present invention also encompasses other types of wireless access terminals, including fixed wireless terminals. For the sake of simplicity, only mobile stations are shown and discussed hereafter. However, it should be understood that the use of the term "mobile station" in the claims and in the description below is intended to encompass both truly mobile devices (e.g., cell phones, wireless laptops) and stationary wireless terminals (e.g., a machine monitor with wireless capability).

Dotted lines show the approximate boundaries of cell sites 121-123 in which base stations 101-103 are located. The cell sites are shown approximately circular for the purposes of illustration and explanation only. It should be clearly understood that the cell sites may have other irregular shapes, depending on the cell configuration selected and natural and man-made obstructions.

As is well known in the art, each of cell sites 121-123 is comprised of a plurality of sectors, where a directional antenna coupled to the base station illuminates each sector. The embodiment of FIG. 1 illustrates the base station in the center of the cell. Alternate embodiments may position the directional antennas in corners of the sectors. The system of the present invention is not limited to any particular cell site configuration.

In one embodiment of the present invention, each of BS 101, BS 102 and BS 103 comprises a base station controller (BSC) and one or more base transceiver subsystem(s) (BTS). Base station controllers and base transceiver subsystems are well known to those skilled in the art. A base station controller is a device that manages wireless communications resources, including the base transceiver subsystems, for specified cells within a wireless communications network. A base transceiver subsystem comprises the RF transceivers, antennas, and other electrical equipment located in each cell site. This equipment may include air conditioning units, heating units, electrical supplies, telephone line interfaces and RF transmitters and RF receivers. For the purpose of simplicity and clarity in explaining the operation of the present invention, the base transceiver subsystems in each of cells 121, 122 and 123 and the base station controller associated with each base transceiver subsystem are collectively represented by BS 101, BS 102 and BS 103, respectively.

BS 101, BS 102 and BS 103 transfer voice and data signals between each other and the public switched telephone network (PSTN) (not shown) via communication line 131 and mobile switching center (MSC) 140. BS 101, BS 102 and BS 103 also transfer data signals, such as packet data, with the Internet (not shown) via communication line 131 and packet data server node (PDSN) 150. Packet control function (PCF) unit 190 controls the flow of data packets between base stations 101-103 and PDSN 150. PCF unit 190 may be implemented as part of PDSN 150, as part of MSC 140, or as a stand-alone device that communicates with PDSN 150, as shown in FIG. 1. Line 131 also provides the connection path for control signals transmitted between MSC 140 and BS 101, BS 102 and BS 103 that establish connections for voice and data circuits between MSC 140 and BS 101, BS 102 and BS 103.

Communication line 131 may be any suitable connection means, including a T1 line, a T3 line, a fiber optic link, a network packet data backbone connection, or any other type of data connection. Line 131 links each vocoder in the BSC with switch elements in MSC 140. The connections on line 131 may transmit analog voice signals or digital voice signals in pulse code modulated (PCM) format, Internet Protocol (IP) format, asynchronous transfer mode (ATM) format, or the like.

MSC 140 is a switching device that provides services and coordination between the subscribers in a wireless network and external networks, such as the PSTN or Internet. MSC 140 is well known to those skilled in the art. In some embodiments of the present invention, communications line 131 may be several different data links where each data link couples one of BS 101, BS 102, or BS 103 to MSC 140.

In the exemplary wireless network 100, MS 111 is located in cell site 121 and is in communication with BS 101. MS 113 is located in cell site 122 and is in communication with BS 102. MS 114 is located in cell site 123 and is in communication with BS 103. MS 112 is also located close to the edge of cell site 123 and is moving in the direction of cell site 123, as indicated by the direction arrow proximate MS 112. At some point, as MS 112 moves into cell site 123 and out of cell site 121, a hand-off will occur.

Figure 2:
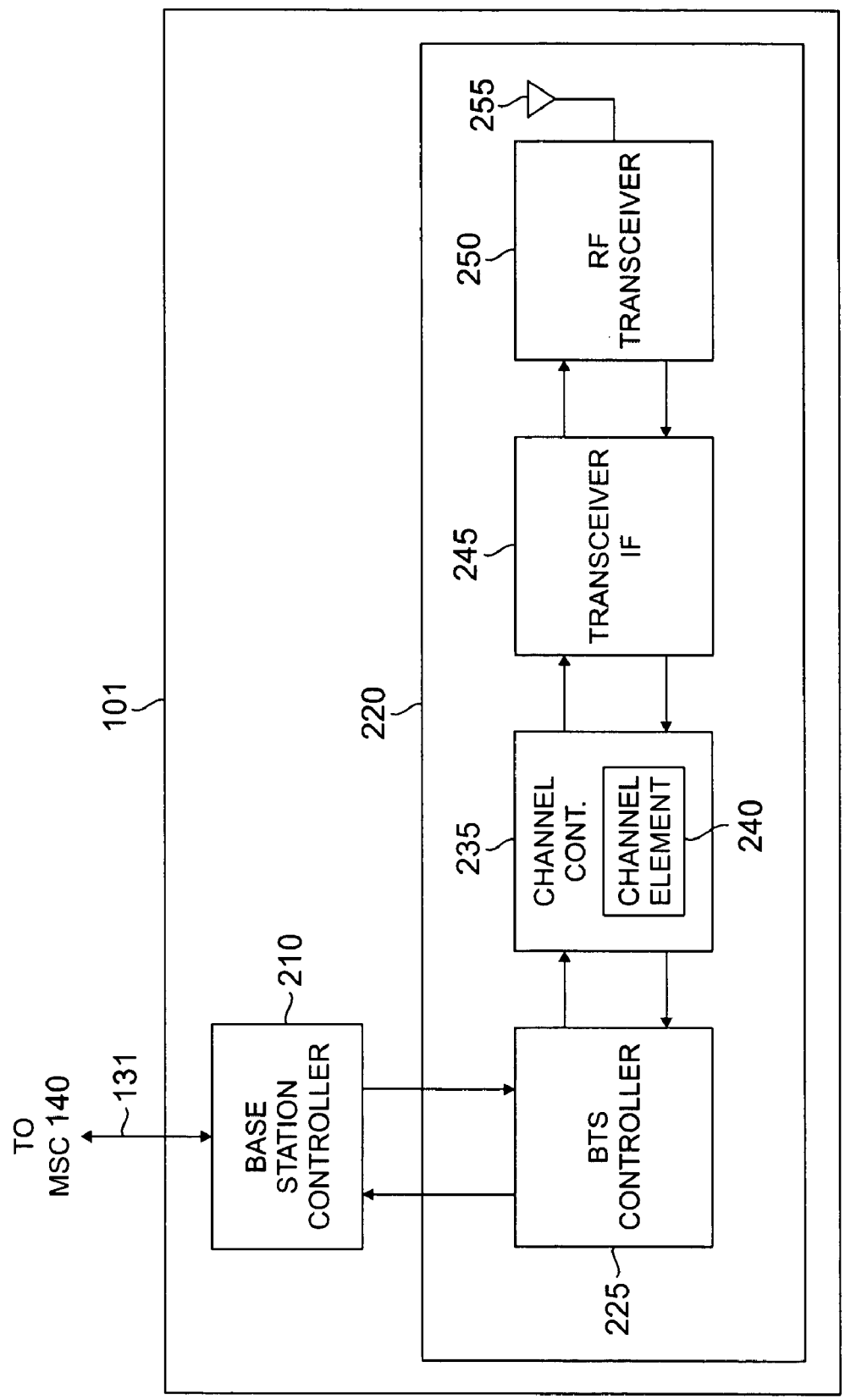
FIG. 2 illustrates an exemplary base station according to an exemplary embodiment of the present invention.

FIG. 2 illustrates exemplary base station 101 in greater detail according to an exemplary embodiment of the present invention. Base station 101 comprises base station controller (BSC) 210 and base transceiver station (BTS) 220. Base station controllers and base transceiver stations were described previously in connection with FIG. 1. BSC 210 manages the resources in cell site 121, including BTS 220. BTS 120 comprises BTS controller 225, channel controller 235 (which contains representative channel element 240), transceiver interface (IF) 245, RF transceiver 250, and antenna array 255.

BTS controller 225 comprises processing circuitry and memory capable of executing an operating program that controls the overall operation of BTS 220 and communicates with BSC 210. Under normal conditions, BTS controller 225 directs the operation of channel controller 235, which contains a number of channel elements, including channel element 240, that perform bi-directional communications in the forward channel and the reverse channel. A "forward" channel refers to outbound signals from the base station to the mobile station and a "reverse" channel refers to inbound signals from the mobile station to the base station. Transceiver IF 245 transfers the bi-directional channel signals between channel controller 240 and RF transceiver 250.

Antenna array 255 transmits forward channel signals received from RF transceiver 250 to mobile stations in the coverage area of BS 101. Antenna array 255 also sends to RF transceiver 250 reverse channel signals received from mobile stations in the coverage area of BS 101. In a preferred embodiment of the present invention, antenna array 255 is multi-sector antenna, such as a three-sector antenna in which each antenna sector is responsible for transmitting and receiving in a 120° arc of coverage area. Additionally, RF transceiver 250 may contain an antenna selection unit to select among different antennas in antenna array 255 during both transmit and receive operations.

Figure 3:
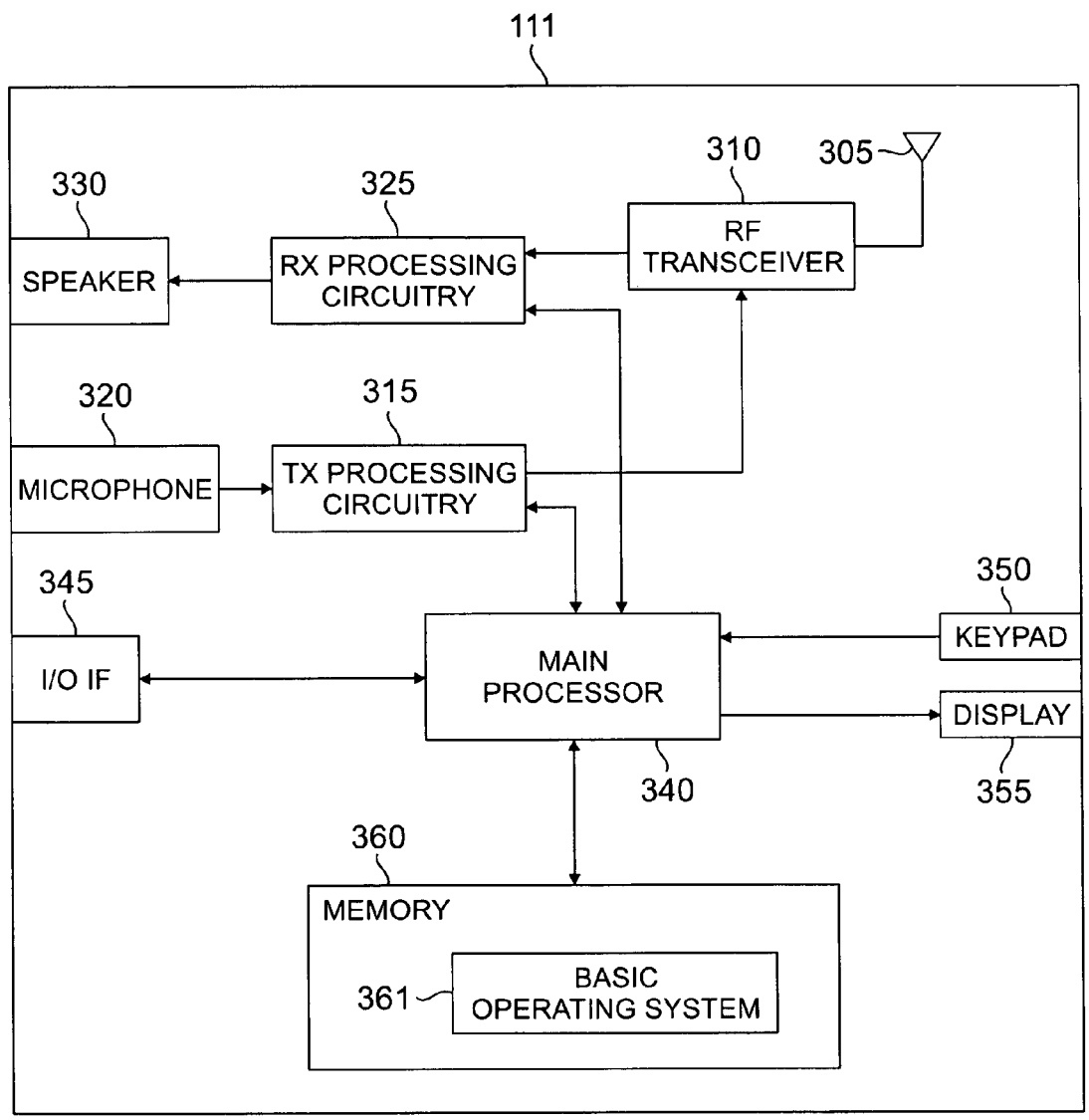
FIG. 3 illustrates a wireless mobile station according to an advantageous embodiment of the present invention.

FIG. 3 illustrates wireless mobile station 111 according to an advantageous embodiment of the present invention. Wireless mobile station 111 comprises antenna 305, radio frequency (RF) transceiver 310, transmit (TX) processing circuitry 315, microphone 320, and receive (RX) processing circuitry 325. MS 111 also comprises speaker 330, main processor 340, input/output (I/O) interface (IF) 345, keypad 350, display 355, and memory 360. Memory 360 further comprises basic operating system (OS) program 361.

Radio frequency (RF) transceiver 310 receives from antenna 305 an incoming RF signal transmitted by a base station of wireless network 100. Radio frequency (RF) transceiver 310 down-converts the incoming RF signal to produce an intermediate frequency (IF) or a baseband signal. The IF or baseband signal is sent to receiver (RX) processing circuitry 325 that produces a processed baseband signal by filtering, decoding, and/or digitizing the baseband or IF signal. Receiver (RX) processing circuitry 325 transmits the processed baseband signal to speaker 330 (i.e., voice data) or to main processor 340 for further processing (e.g., web browsing).

Transmitter (TX) processing circuitry 315 receives analog or digital voice data from microphone 320 or other outgoing baseband data (e.g., web data, e-mail, interactive video game data) from main processor 340. Transmitter (TX) processing circuitry 315 encodes, multiplexes, and/or digitizes the outgoing baseband data to produce a processed baseband or IF signal. Radio frequency (RF) transceiver 310 receives the outgoing processed baseband or IF signal from transmitter (TX) processing circuitry 315. Radio frequency (RF) transceiver 310 up-converts the baseband or IF signal to a radio frequency (RF) signal that is transmitted via antenna 305.

In an advantageous embodiment of the present invention, main processor 340 is a microprocessor or microcontroller. Memory 360 is coupled to main processor 340. According to an advantageous embodiment of the present invention, part of memory 360 comprises a random access memory (RAM) and another part of memory 360 comprises a Flash memory, which acts as a read-only memory (ROM).

Main processor 340 executes basic operating system (OS) program 361 stored in memory 360 in order to control the overall operation of wireless mobile station 111. In one such operation, main processor 340 controls the reception of forward channel signals and the transmission of reverse channel signals by radio frequency (RF) transceiver 310, receiver (RX) processing circuitry 325, and transmitter (TX) processing circuitry 315, in accordance with well-known principles.

Main processor 340 is capable of executing other processes and programs resident in memory 360. Main processor 340 can move data into or out of memory 360, as required by an executing process. Main processor 340 is also coupled to I/O interface 345. I/O interface 345 provides mobile-station 111 with the ability to connect to other devices such as laptop computers and handheld computers. I/O interface 345 is the communication path between these accessories and main controller 340.

Main processor 340 is also coupled to keypad 350 and display unit 355. The operator of mobile station 111 uses keypad 350 to enter data into mobile station 111. Display 355 may be a liquid crystal display capable of rendering text and/or at least limited graphics from web sites. Alternate embodiments may use other types of displays.

Figure 4:
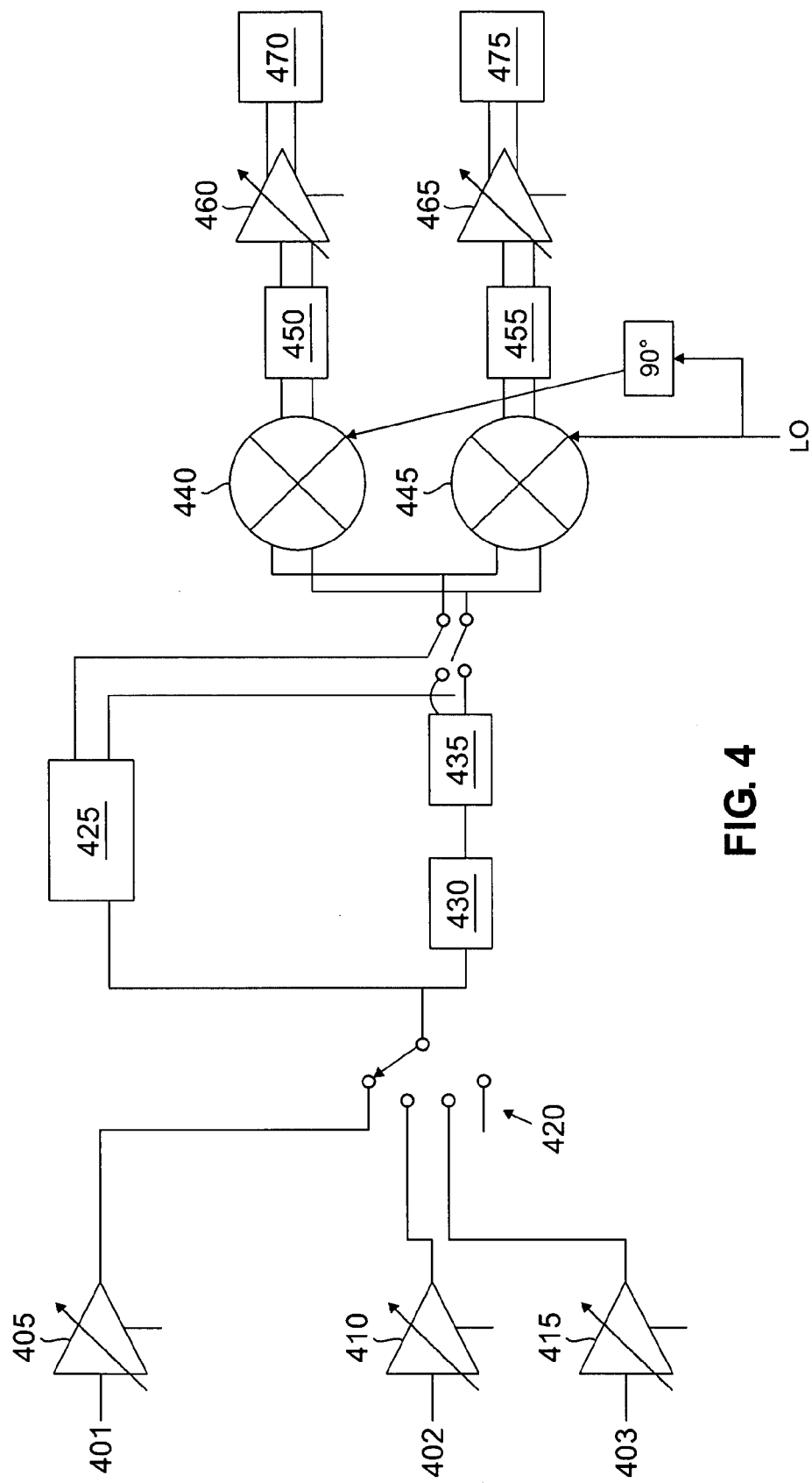
FIG. 4 illustrates an exemplary embodiment of the WDMA receiver architecture according to the principles of the present invention.

FIG. 4 illustrates an exemplary embodiment of the WCDMA receiver architecture according to the principles of the present invention. This block diagram illustrates a WCDMA receiver without an external inter-stage RF-SAW filter for each band.

A receiver such as that illustrated in FIG. 4 can be used as part of the implementation of RF transceiver 250 as shown in the base station of FIG. 2, and is particularly advantageous when used as part of the implementation of RF transceiver 310 as shown in the mobile station of FIG. 3. The need to support multi-band for WCDMA while minimizing PCB real estate and component count requires a highly integrated RF ASIC solution that meets the 3GPP TS25.101 Requirements. This puts a constraint on the number of external RF-SAW filters that can be used in a receiver. RF-SAW filters are commonly found in conventional design for WCDMA handset receivers between the LNA and the mixer for each band. Thus, for example, a Quad band WCDMA receiver may implement four (4) such external RF-SAW filters. Also, the conventional design approach of using a single-ended LNA output and a differential mixer input requires 12 pin-outs for accommodating the four filters. These additional pin counts also mean a larger RF ASIC package size.

The exemplary architecture depicted in FIG. 4 allows for the optimization of performance for reference sensitivity while meeting all blockers requirements in 3GPP TS25.101. The present invention applies a combination of system design manipulation, which includes the addition of integrated analog variable gain blocks, an additional gain step for the LNA, and fixed integrated filtering.

The present invention uses a 3-step gain control for the LNA that allows switching to mid-gain at certain blocker tests, but may achieve the maximum gain required to optimize receiver sensitivity. In this way, the LNA maximum gain may be designed higher for better overall receiver Noise Figure performance, which translates to better sensitivity. The $3^{rd}$ step gain is used when the signal input reaches very high levels so that the LNA can be bypassed to avoid saturating the back-end of the receiver and to save power consumption.

In the design of an ASIC that supports Tri-Band WCDMA, three LNAs 405/410/415 are used to handle the three bands, shown as input 401 for 2110-2170 MHz, input 402 for 1930-1990 MHz, and input 403 for 869-894 MHz. These inputs 402/402/403 are connected to the respective duplexers and switches of a conventional receiver, as known to those of skill in the art. As such, an integrated switch 420 is proposed as shown in FIG. 4 to facilitate all the options.

The receiver also uses a fixed integrated band pass filter 430 centered at the various bands that can provide several dB of transmit band rejection right after the LNA. It also has a Balun 435 for matching after the switch. This receiver preferably uses at least a minimum performance of the mixer that is commercially competitive, particularly in its linearity with an Input IP3 of 7 dBm or better. The conversion gain of the mixer is less consequential as long it has some power gain because, after analog baseband filtering at baseband filters 450/455, an analog Variable Gain Amplifier (VGA) block 460/465 provides up to a maximum of 10 dB power gain with a dynamic range of approximately 25 dB.

This Variable Gain block also reduces the dynamic range requirement of the WCDMA ΣΔ ADC 470/475 after the VGA 460/465. Integrated low pass filtering may be needed between the VGA 460/465 and the ΣΔ ADC 470/475, depending on the linearity of the ADC. The analog VGA also allows for the reduction of blocker effects, such as inter-modulation products, at the ADC by attenuating at certain settings that are programmable. This proposed receiver reduces the analog VGA gain first to a minimum before any adjustment is made at the digital VGA in the digital IF.

One particular feature of a preferred embodiment is the ability to meet 3GPP TS 25.101 Requirements for an FDD WCDMA Receiver in Class I through Class VI without an external filter between the LNA and the mixer. Integrated bandpass filters with much lower selectivity requirements may be implemented between the LNA and the mixers instead. This technique at the same time optimizes the receiver sensitivity performance.

A preferred embodiment makes the following assumptions regarding competitive mixer performance:

1) Conversion Gain approximately 3 dB (Power Gain);
2) DSB Noise Figure approximately 8 dB;

3) Input IP3 approximately 7 dBm; and

4) Input IP2 approximately 70 dBm (at input differential impedance of 200 Ω for a direct-conversion I/O mixer).

Various embodiments include a base station and mobile station, wherein the base station/mobile station includes a sufficiently linear operation in the low-noise amplifier, direct conversion mixer, variable gain amplifier, and analog-to-digital converter that all transmitter leakage and interferer power can be removed in the ensuing digital baseband filter blocks and wherein the base station/mobile station has no additional analog baseband filters.

Although the present invention has been described with an exemplary embodiment, various changes and modifications may be suggested to one skilled in the art. It is intended that the present invention encompass such changes and modifications as fall within the scope of the appended claims.

What is claimed is:

1. A radio-frequency (RF) receiver comprising:
   a 3-step gain-control low noise amplifier stage for amplifying a received RF signal, the 3-step gain-control low noise amplifier stage comprising three low noise amplifiers, each low noise amplifier configured to support a distinct, specified band of RF signals;
   a switch for selecting one of the low noise amplifiers of the 3-step gain-control low noise amplifier stage;
   a direct conversion mixer for down-converting an amplified output of said 3-step gain-control low noise amplifier stage, wherein the amplified output corresponds to the low noise amplifier selected by the switch;
   a variable gain amplifier for amplifying a down-converted output of said direct conversion mixer; and
   a sigma-delta analog-to-digital converter connected to the variable gain amplifier, wherein the receiver has sufficiently linear operation in the low-noise amplifier stage, direct conversion mixer, variable gain amplifier, and analog-to-digital converter that all transmitter leakage and interferer power can be removed in subsequent digital baseband filter blocks to eliminate the need for additional analog baseband filters.

2. The receiver of claim 1, further comprising a baseband filter between the direct conversion mixer and the variable gain amplifier.

3. A mobile station for use in a wireless network system, comprising:
   a processor and accessible memory; and
   a transceiver connected to communicate with the processor, the transceiver having
      a 3-step gain-control low noise amplifier stage for amplifying a received RF signal, the 3-step gain-control low noise amplifier stage comprising three low noise amplifiers, each low noise amplifier configured to support a distinct, specified band of RF signals,
      a switch for selecting one of the low noise amplifiers of the 3-step gain-control low noise amplifier stage,
      a direct conversion mixer for down-converting an amplified output of said 3-step gain-control low noise amplifier stage, wherein the amplified output corresponds to the low noise amplifier selected by the switch,
      a variable gain amplifier for amplifying a down-converted output of said direct conversion mixer, and
      a sigma-delta analog-to-digital converter connected to the variable gain amplifier, wherein the mobile station includes a sufficiently linear operation in the low-noise amplifier stage, direct conversion mixer, variable gain amplifier, and analog-to-digital converter that all transmitter leakage and interferer power can be removed in subsequent digital baseband filter blocks and wherein the mobile station has no additional analog baseband filters.

4. The mobile station of claim 3, the transceiver further comprising a baseband filter between the direct conversion mixer and the variable gain amplifier.

5. The mobile station of claim 3, wherein the transceiver is configured to operate on a WCDMA wireless network.

6. A base station for use in a wireless network system, comprising:
   a processor and accessible memory; and
   a transceiver connected to communicate with the processor, the transceiver having
      a 3-step gain-control low noise amplifier stage for amplifying a received RF signal, the 3-step gain-control low noise amplifier stage comprising three low noise amplifiers, each low noise amplifier configured to support a distinct, specified band of RF signals,
      a switch for selecting one of the low noise amplifiers of the 3-step gain-control low noise amplifier stage,
      a direct conversion mixer for down-converting an amplified output of said 3-step gain-control low noise amplifier stage, wherein the amplified output corresponds to the low noise amplifier selected by the switch,
      a variable gain amplifier for amplifying a down-converted output of said direct conversion mixer, and
      a sigma-delta analog-to-digital converter connected to the variable gain amplifier, wherein the base station includes a sufficiently linear operation in the low-noise amplifier stage, direct conversion mixer, variable gain amplifier, and analog-to-digital converter that all transmitter leakage and interferer power can be removed in subsequent digital baseband filter blocks and wherein the base station has no additional analog baseband filters.

7. The base station of claim 6, further comprising a baseband filter between the direct conversion mixer and the variable gain amplifier.

8. The base station of claim 6, wherein the transceiver is configured to operate on a WCDMA wireless network.

* * * * *